United States Patent
Rajski et al.

(10) Patent No.: US 6,543,020 B2
(45) Date of Patent: *Apr. 1, 2003

(54) TEST PATTERN COMPRESSION FOR AN INTEGRATED CIRCUIT TEST ENVIRONMENT

(76) Inventors: Janusz Rajski, 6502 Horton Rd., West Linn, OR (US) 97068; Mark Kassab, 29665 SW. Rose La., Apartment 288, Wilsonville, OR (US) 97070; Nilanjan Mukherjee, 29290 SW. Parkway Ct., Apartment 92, Wilsonville, OR (US) 97070; Jerzy Tyszer, Os. Stare Zegrze 89C/2, 61-249 Poznan (PL)

(*) Notice: Subject to any disclaimer, the term of this patent is extended or adjusted under 35 U.S.C. 154(b) by 0 days.

This patent is subject to a terminal disclaimer.

(21) Appl. No.: 09/947,160

(22) Filed: Sep. 4, 2001

(65) Prior Publication Data

US 2002/0053057 A1 May 2, 2002

Related U.S. Application Data

(63) Continuation of application No. 09/619,985, filed on Jul. 20, 2000, now Pat. No. 6,327,687.
(60) Provisional application No. 60/167,446, filed on Nov. 23, 1999.

(51) Int. Cl.[7] .............................................. G06F 11/00
(52) U.S. Cl. ...................................................... 714/738
(58) Field of Search ................................ 714/738, 741, 714/726, 728, 739, 742

(56) References Cited

U.S. PATENT DOCUMENTS

| 3,614,400 A | 10/1971 | Farnett |
| 3,700,869 A | 10/1972 | Low et al. |
| 4,503,537 A | 3/1985 | McAnney |
| 4,513,418 A | 4/1985 | Bardell, Jr. et al. |
| 4,602,210 A | 7/1986 | Fasang et al. |
| 4,687,988 A | 8/1987 | Eichelberger et al. |
| 4,754,215 A | 6/1988 | Kawai |
| 4,785,410 A | 11/1988 | Hamatsu et al. |
| 4,801,870 A | 1/1989 | Eichelberger et al. |
| 4,860,236 A | 8/1989 | McLeod et al. |
| 4,959,832 A | 9/1990 | Bardell, Jr. |
| 4,974,184 A | 11/1990 | Avra |
| 5,090,035 A | 2/1992 | Murase |
| 5,138,619 A | 8/1992 | Fasang et al. |
| 5,173,906 A | 12/1992 | Dreibelbis et al. |

(List continued on next page.)

OTHER PUBLICATIONS

P.H. Bardell, "Design Considerations for Parallel Pseudo-random Pattern Generators", Journal of Electronic Testing: Theory and Applications, 1,73–87 (1990).

(List continued on next page.)

*Primary Examiner*—Christine T. Tu
(74) *Attorney, Agent, or Firm*—Klarquist Sparkman LLP

(57) ABSTRACT

A method for compressing test patterns to be applied to scan chains in a circuit under test. The method includes generating symbolic expressions that are associated with scan cells within the scan chains. The symbolic expressions are created by assigning variables to bits on external input channels supplied to the circuit under test. Using symbolic simulation, the variables are applied to a decompressor to obtain the symbolic expressions. A test cube is created using a deterministic pattern that assigns values to the scan cells to test faults within the integrated circuit. A set of equations is formulated by equating the assigned values in the test cube to the symbolic expressions associated with the corresponding scan cell. The equations are solved to obtain the compressed test pattern.

27 Claims, 9 Drawing Sheets

U.S. PATENT DOCUMENTS

| | | | |
|---|---|---|---|
| 5,268,949 | A | 12/1993 | Watanabe |
| 5,301,199 | A | 4/1994 | Ikenaga et al. |
| 5,325,367 | A | 6/1994 | Dekker et al. |
| 5,369,648 | A | 11/1994 | Nelson |
| 5,394,405 | A | 2/1995 | Savir |
| 5,412,665 | A | 5/1995 | Gruodis et al. |
| 5,414,716 | A | 5/1995 | Bershteyn |
| 5,446,683 | A | 8/1995 | Mullen et al. |
| 5,450,414 | A | 9/1995 | Lin |
| 5,574,733 | A | 11/1996 | Kim |
| 5,586,125 | A | 12/1996 | Warner |
| 5,592,493 | A | 1/1997 | Crouch et al. |
| 5,612,963 | A | 3/1997 | Koenemann et al. |
| 5,631,913 | A | 5/1997 | Maeda |
| 5,694,402 | A | 12/1997 | Butler et al. |
| 5,719,913 | A | 2/1998 | Maeno |
| 5,748,497 | A | 5/1998 | Scott et al. |
| 5,790,562 | A | 8/1998 | Murray et al. |
| 5,790,626 | A | 8/1998 | Johnson et al. |
| 5,831,992 | A | 11/1998 | Wu |
| 5,899,961 | A | 5/1999 | Sundermann |
| 5,905,986 | A | 5/1999 | Rohrbaugh et al. |
| 5,974,433 | A | 10/1999 | Currie |
| 5,991,898 | A | 11/1999 | Rajski et al. |
| 5,991,909 | A | 11/1999 | Rajski et al. |
| 6,006,349 | A | 12/1999 | Fujisaki |
| 6,072,823 | A | 6/2000 | Takakusaki |
| 6,141,669 | A | 10/2000 | Carleton |
| 6,158,032 | A | 12/2000 | Currier et al. |
| 6,300,885 | B1 | 10/2001 | Davenport .................... 341/50 |
| 6,327,687 | B1 * | 12/2001 | Rajski et al. ............... 714/738 |
| 6,353,842 | B1 * | 3/2002 | Rajski et al. ............... 708/252 |
| 6,385,750 | B1 | 5/2002 | Kapur et al. ................ 714/738 |

OTHER PUBLICATIONS

I. Hamzaoglu, J. Patel, "Reducing Test Application Time for Full Scan Embedded Cores," Center for Reliable & High–Performance Computing, University of Illinois, Urbana, IL., 1999 IEEE.

S. Hellebrand, J. Rajski, S. Tarnick, S. Venkataraman, B. Courtois, "Built–in Test for Circuits With Scan Based on Reseeding of Multiple Polynomial Linear Feedback Shift Registers", *IEEE Trans. On Computers*, vol. C–44, pp. 223–233, 1995.

S. Hellebrand, B. Reeb, S. Tarnick, H–J Wunderlich, "Pattern Generation for a Deterministic BIST Scheme", pp. 88–941995 IEEE.

B. Koenemann c/o IBM Corp., B56/901, "LFSR–Coded Test Patterns for Scan Designs", *Proceedings of European Test Conference*, pp. 237–242, 1991.

J. Rajski,J. Tyszer, N. Zacharia, "Decompression of Test Data Using Variable–Length Seed LFSRs", Microelectronics and Computer Systems Laboratory, McGill University, Montreal, Canada, 1995 IEEE.

J. Rajski, J. Tyszer, N. Zacharia, "Test Data Decompression for Multiple Scan Designs with Boundary Scan," IEEE Transactions on Computers, vol. 47, No. 11, Nov. 1998.

J. Rajski and J. Tyszer, "Design of Phase Shifters for BIST Applications", *Proc. VLSI Test Symposium*, pp. 218–224, 1998.

J. Rajski, N. Tamarapalli, J. Tyszer, "Automated Synthesis of Large Phase Shifters for Built–In Self–Test," International Test Conference, Paper 41.1, pp. 1047–1056, IEEE 1998.

Venkataraman, Rajski, Hellebrand, and Tarnick, "An Efficient BIST Scheme Based on Reseeding of Multiple Polynomial Linear Feedback Shift Registers", pp. 572–577, 1993 IEEE.

Bershteyn, M., "Calculation of Multiple Sets of Weights for Weighted Random Testing," International Test Conference 1993, Paper 45.3, pp. 1031–1040.

Zacharia, N., "Decompression of Test Data Using Variable–Length Seed LFSRs," IEEE 1995, 426–432.

Mano, M. Morris, "Computer System Architecture," $2^{nd}$ Edition, Prentice–Hall, Inc., New Jersey, 1982.

* cited by examiner

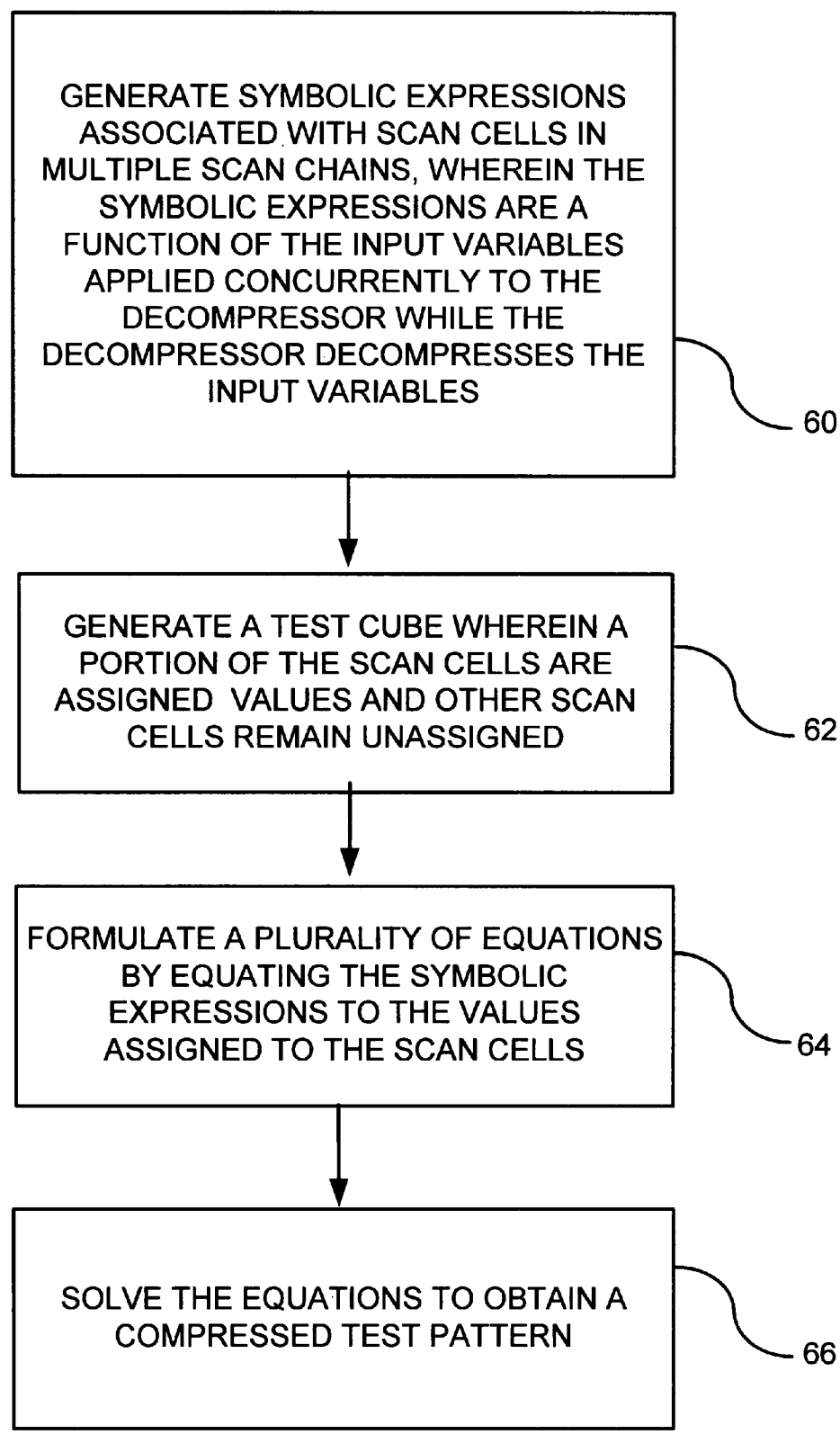

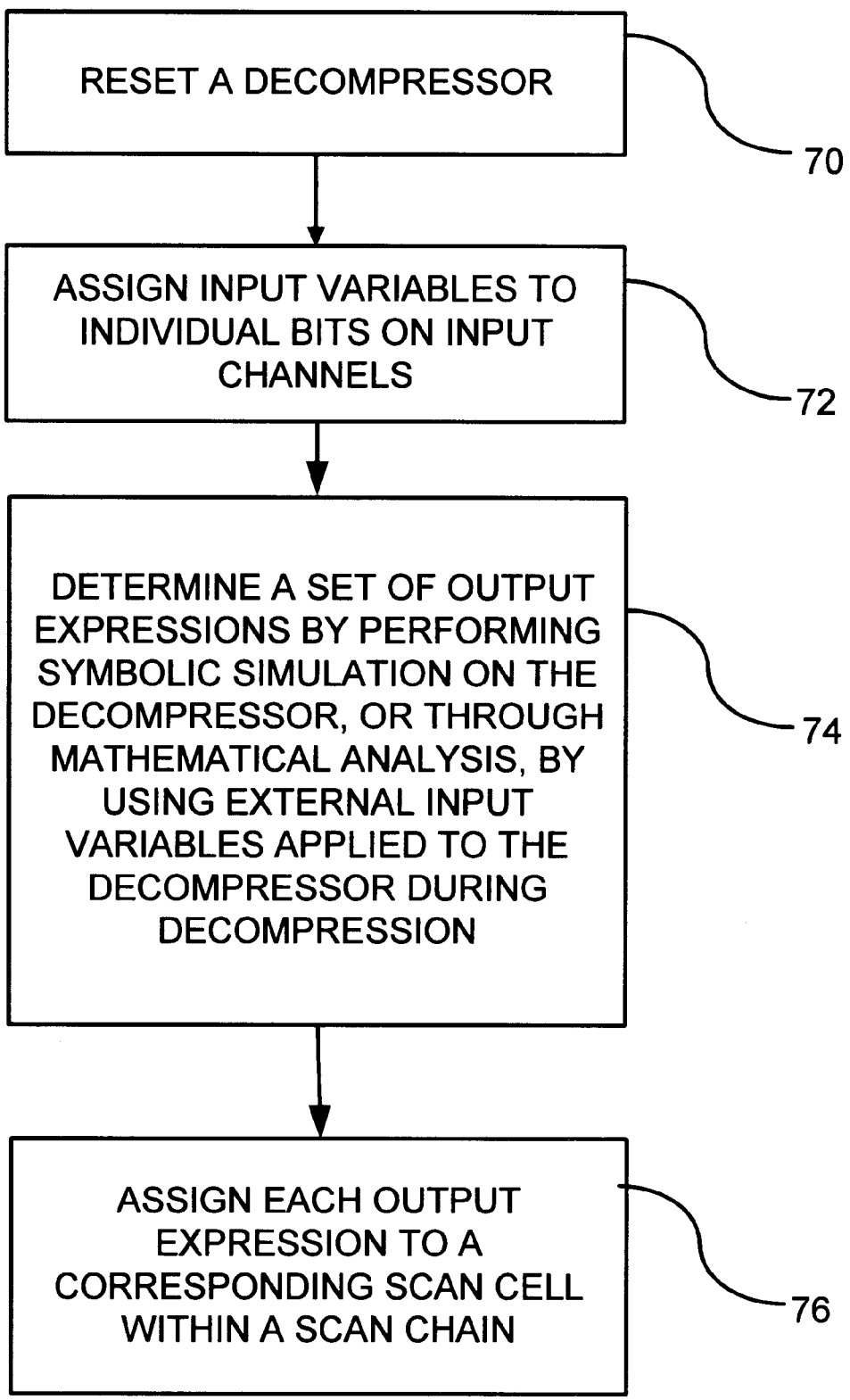

Scan chain 0
$a_2 \oplus a_4 \oplus a_5$
$a_4 \oplus a_6 \oplus a_7$
$a_1 \oplus a_6 \oplus a_8 \oplus a_9$
$a_1 \oplus a_3 \oplus a_8 \oplus a_{10} \oplus a_{11}$
$a_3 \oplus a_5 \oplus a_{10} \oplus a_{12} \oplus a_{13}$
$a_0 \oplus a_1 \oplus a_4 \oplus a_5 \oplus a_8 \oplus a_9 \oplus a_{11} \oplus a_{12} \oplus a_{13} \oplus a_{16}$
$a_0 \oplus a_2 \oplus a_7 \oplus a_9 \oplus a_{14} \oplus a_{16} \oplus a_{17}$
$a_0 \oplus a_2 \oplus a_4 \oplus a_9 \oplus a_{11} \oplus a_{16} \oplus a_{18} \oplus a_{19}$ Scan chain 1
$a_1 \oplus a_2 \oplus a_3 \oplus a_6$
$a_0 \oplus a_1 \oplus a_3 \oplus a_4 \oplus a_5 \oplus a_8$
$a_2 \oplus a_3 \oplus a_5 \oplus a_6 \oplus a_7 \oplus a_{10}$
$a_0 \oplus a_1 \oplus a_4 \oplus a_5 \oplus a_7 \oplus a_8 \oplus a_9 \oplus a_{12}$
$a_2 \oplus a_3 \oplus a_6 \oplus a_7 \oplus a_9 \oplus a_{10} \oplus a_{11} \oplus a_{14}$
$a_0 \oplus a_5 \oplus a_7 \oplus a_{12} \oplus a_{14} \oplus a_{15}$
$a_0 \oplus a_2 \oplus a_3 \oplus a_6 \oplus a_7 \oplus a_{10} \oplus a_{11} \oplus a_{13} \oplus a_{14} \oplus a_{15} \oplus a_{18}$
$a_0 \oplus a_1 \oplus a_2 \oplus a_4 \oplus a_5 \oplus a_8 \oplus a_9 \oplus a_{12} \oplus a_{13} \oplus a_{15} \oplus a_{16} \oplus a_{17} \oplus a_{20}$ Scan chain 2
$a_3$
$a_0 \oplus a_5$
$a_2 \oplus a_7$
$a_0 \oplus a_4 \oplus a_9$
$\boxed{a_2 \oplus a_6 \oplus a_{11}}$
$\boxed{a_0 \oplus a_1 \oplus a_4 \oplus a_8 \oplus a_{13}}$
$a_0 \oplus a_2 \oplus a_3 \oplus a_6 \oplus a_{10} \oplus a_{15}$
$a_1 \oplus a_2 \oplus a_4 \oplus a_5 \oplus a_8 \oplus a_{12} \oplus a_{17}$ Scan chain 3
$a_0 \oplus a_1 \oplus a_5 \oplus a_7$
$a_2 \oplus a_3 \oplus a_7 \oplus a_9$
$\boxed{a_4 \oplus a_5 \oplus a_9 \oplus a_{11}}$
$a_6 \oplus a_7 \oplus a_{11} \oplus a_{13}$
$a_1 \oplus a_8 \oplus a_9 \oplus a_{13} \oplus a_{15}$
$a_0 \oplus a_3 \oplus a_{10} \oplus a_{11} \oplus a_{15} \oplus a_{17}$
$\boxed{a_0 \oplus a_2 \oplus a_5 \oplus a_{12} \oplus a_{13} \oplus a_{17} \oplus a_{19}}$
$a_2 \oplus a_4 \oplus a_7 \oplus a_{14} \oplus a_{15} \oplus a_{19} \oplus a_{21}$ Scan chain 4
$a_0 \oplus a_4 \oplus a_7$
$a_0 \oplus a_2 \oplus a_6 \oplus a_9$
$a_0 \oplus a_1 \oplus a_2 \oplus a_4 \oplus a_8 \oplus a_{11}$
$a_0 \oplus a_2 \oplus a_3 \oplus a_4 \oplus a_6 \oplus a_{10} \oplus a_{13}$
$\boxed{a_1 \oplus a_2 \oplus a_4 \oplus a_5 \oplus a_6 \oplus a_8 \oplus a_{12} \oplus a_{15}}$
$a_1 \oplus a_3 \oplus a_4 \oplus a_6 \oplus a_7 \oplus a_8 \oplus a_{10} \oplus a_{14} \oplus a_{17}$
$a_1 \oplus a_3 \oplus a_5 \oplus a_6 \oplus a_8 \oplus a_9 \oplus a_{10} \oplus a_{12} \oplus a_{16} \oplus a_{19}$
$\boxed{a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21}}$ Scan chain 5
$a_0 \oplus a_5 \oplus a_6$
$a_0 \oplus a_1 \oplus a_2 \oplus a_7 \oplus a_8$
$\boxed{a_2 \oplus a_3 \oplus a_4 \oplus a_9 \oplus a_{10}}$
$a_0 \oplus a_4 \oplus a_5 \oplus a_6 \oplus a_{11} \oplus a_{12}$
$\boxed{a_0 \oplus a_1 \oplus a_2 \oplus a_6 \oplus a_7 \oplus a_8 \oplus a_{13} \oplus a_{14}}$
$a_0 \oplus a_1 \oplus a_2 \oplus a_3 \oplus a_4 \oplus a_8 \oplus a_9 \oplus a_{10} \oplus a_{15} \oplus a_{16}$
$a_2 \oplus a_3 \oplus a_4 \oplus a_5 \oplus a_6 \oplus a_{10} \oplus a_{11} \oplus a_{12} \oplus a_{17} \oplus a_{18}$
$a_1 \oplus a_4 \oplus a_5 \oplus a_6 \oplus a_7 \oplus a_8 \oplus a_{12} \oplus a_{13} \oplus a_{14} \oplus a_{19} \oplus a_{20}$ Scan chain 6
$a_0 \oplus a_1 \oplus a_2 \oplus a_6$
$a_1 \oplus a_2 \oplus a_3 \oplus a_4 \oplus a_8$
$\boxed{a_3 \oplus a_4 \oplus a_5 \oplus a_6 \oplus a_{10}}$
$a_1 \oplus a_5 \oplus a_6 \oplus a_7 \oplus a_8 \oplus a_{12}$
$\boxed{a_0 \oplus a_1 \oplus a_3 \oplus a_7 \oplus a_8 \oplus a_9 \oplus a_{10} \oplus a_{14}}$
$a_0 \oplus a_2 \oplus a_3 \oplus a_5 \oplus a_9 \oplus a_{10} \oplus a_{11} \oplus a_{12} \oplus a_{16}$
$a_0 \oplus a_2 \oplus a_4 \oplus a_5 \oplus a_7 \oplus a_{11} \oplus a_{12} \oplus a_{13} \oplus a_{14} \oplus a_{18}$
$a_0 \oplus a_2 \oplus a_4 \oplus a_6 \oplus a_7 \oplus a_9 \oplus a_{13} \oplus a_{14} \oplus a_{15} \oplus a_{16} \oplus a_{20}$
$\oplus a_{19}$ Scan chain 7
$a_2 \oplus a_3 \oplus a_5$
$a_0 \oplus a_4 \oplus a_5 \oplus a_7$
$a_0 \oplus a_2 \oplus a_6 \oplus a_7 \oplus a_9$
$a_1 \oplus a_2 \oplus a_4 \oplus a_8 \oplus a_9 \oplus a_{11}$
$a_0 \oplus a_3 \oplus a_4 \oplus a_6 \oplus a_{10} \oplus a_{11} \oplus a_{13}$
$a_1 \oplus a_2 \oplus a_5 \oplus a_6 \oplus a_8 \oplus a_{12} \oplus a_{13} \oplus a_{15}$
$a_1 \oplus a_3 \oplus a_4 \oplus a_7 \oplus a_8 \oplus a_{10} \oplus a_{14} \oplus a_{15} \oplus a_{17}$
$a_0 \oplus a_3 \oplus a_5 \oplus a_6 \oplus a_9 \oplus a_{10} \oplus a_{12} \oplus a_{16} \oplus a_{17}$

FIG. 7

TEST PATTERN COMPRESSION FOR AN INTEGRATED CIRCUIT TEST ENVIRONMENT

RELATED APPLICATION DATA

This application claims the benefit of U.S. Provisional Application No. 60/167,446 filed Nov. 23, 1999, which is hereby incorporated by reference. This application is also a continuation of patent application No. 09/619,985 filed Jul. 20, 2000, now U.S. Pat. No. 6,327,687.

TECHNICAL FIELD

This invention relates generally to testing of integrated circuits and, more particularly, to the generation and application of test data in the form of patterns, or vectors, to scan chains within a circuit-under-test.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational network. The most-often used DFT methodology is based on scan chains. It assumes that during testing, all (or almost all) memory elements are connected into one or more shift registers, as shown in the U.S. Pat. No. 4,503,537. A circuit that has been designed for test has two modes of operation: a normal mode, and a test or scan mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit-under-test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2–5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

Because of the random fill requirement, however, the test patterns are grossly over-specified. These large test patterns require extensive tester memory to store and a considerable time to apply from the tester to a circuit-under-test. FIG. 1 is a block diagram of a conventional system 18 for testing digital circuits with scan chains. External automatic testing equipment (ATE), or tester, 20 applies a set of fully specified test patterns 22 one by one to a CUT 24 in scan mode via scan chains 26 within the circuit. The circuit is then run in normal mode using the test pattern as input, and the test response to the test pattern is stored in the scan chains. With the circuit again in scan mode, the response is then routed to the tester 20, which compares the response with a fault-free reference response 28, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework, as shown in the U.S. Pat. No. 4,503,537. In BIST, additional on-chip circuitry is included to generate test patterns, evaluate test responses, and control the test. In conventional logic BIST, where pseudo-random patterns are used as test patterns, 95–96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. Very often the tester memory required to store the supplemental patterns in BIST exceeds 50% of the memory required in the deterministic approach described above. Another limitation of BIST is that other types of faults, such as transition or path delay faults, are not handled efficiently by pseudo-random patterns.

Because of the complexity of the circuits and the limitations inherent in BIST, it is extremely difficult, if not impossible, to provide a set of specified test patterns that fully covers hard-to-test faults.

Weighted pseudo-random testing is another method that is used to address the issue of the random pattern resistant faults. In principle, this approach expands the pseudo-random test pattern generators by biasing the probabilities of the input bits so that the tests needed for hard-to-test faults are more likely to occur. In general, however, a circuit may require a very large number of sets of weights, and, for each weight set, a number of random patterns have to be applied. Thus, although the volume of test data is usually reduced in comparison to fully specified deterministic test patterns, the resultant test application time increases. Moreover, weighted pseudo-random testing still leaves a fraction of the fault list left uncovered. Details of weighted random pattern test systems and related methods can be found in a number of references including U.S. Pat. Nos. 4,687,988; 4,801,870;

5,394,405; 5,414,716; and 5,612,963. Weighted random patterns have been primarily used as a solution to compress the test data on the tester. The generation hardware appears to be too complex to place it on the chip. Consequently, the voluminous test data is produced off-chip and must pass through relatively slow tester channels to the circuit-under-test. Effectively, the test application time can be much longer than that consumed by the conventional deterministic approach using ATPG patterns.

Several methods to compress test data before transferring it to the circuit-under-test have been suggested. They are based on the observation that the test cubes (i.e., the arrangement of test patterns bits as they are stored within the scan chains of a circuit-under-test) frequently feature a large number of unspecified (don't care) positions. One method, known as reseeding of linear feedback shift registers (LFSRs), was first proposed in B. Koenemann, "LFSR-Coded Test Patterns For Scan Designs," *Proc. European Test Conference*, pp. 237–242 (1991). Consider an n-bit LFSR with a fixed polynomial. Its output sequence is then completely determined by the initial seed. Thus, applying the feedback equations recursively provides a system of linear equations depending only on the seed variables. These equations can be associated with the successive positions of the LFSR output sequence. Consequently, a seed corresponding to the actual test pattern can be determined by solving the system of linear equations, where each equation represents one of the specified positions in the test pattern. Loading the resultant seed into the LFSR and subsequently clocking it will produce the desired test pattern. A disadvantage of this approach, however, is that seed, which encodes the contents of the test cube, is limited to approximately the size of the LFSR. If the test cube has more specified positions than the number of stages in LFSR, the test cube cannot be easily encoded with a seed. Another disadvantage of this approach is the time it requires. A tester cannot fill the LFSR with a seed concurrently with the LFSR generating a test pattern from the seed. Each of these steps must be done at mutually exclusive times. This makes the operation of the tester very inefficient, i.e., when the seed is serially loaded to the LFSR the scan chains do not operate; and when the loading of the scan chains takes place, the tester cannot transfer a seed to the LFSR.

Another compression method is based on reseeding of multiple polynomial LFSRs (MP-LFSRs) as proposed in S. Hellebrand et al., "Built-In Test For Circuits With Scan Based On Reseeding of Multiple Polynomial Linear Feedback Shift Registers," *IEEE Trans. On Computers*, vol. C-44, pp. 223–233 (1995). In this method, a concatenated group of test cubes is encoded with a number of bits specifying a seed and a polynomial identifier. The content of the MP-LFSR is loaded for each test group and has to be preserved during the decompression of each test cube within the group. The implementation of the decompressor involves adding extra memory elements to avoid overwriting the content of the MP-LFSR during the decompression of a group of test patterns. A similar technique has been also discussed in S. Hellebrand et al., "Pattern generation for a deterministic BIST scheme," *Proc. ICCAD*, pp. 88–94 (1995). Reseeding of MP-LFSRs was further enhanced by adopting the concept of variable-length seeds as described in J. Rajski et al., "Decompression of test data using variable-length seed LFSRs", *Proc. VLSI Test Symposium*, pp. 426–433 (1995) and in J. Rajski et al., "Test Data Decompression for Multiple Scan Designs with Boundary Scan", *IEEE Trans. on Computers*, vol. C-47, pp. 1188–1200 (1998). This technique has a potential for significant improvement of test pattern encoding efficiency, even for test cubes with highly varying number of specified positions. The same documents propose decompression techniques for circuits with multiple scan chains and mechanisms to load seeds into the decompressor structure through the boundary-scan.

Although this scheme significantly improves encoding capability, it still suffers from the two drawbacks noted above: seed-length limitations and mutually exclusive times for loading the seed and generating test patterns therefrom.

Thus, most reseeding methods to date suffer from the following limitations. First, the encoding capability of reseeding is limited by the length of the LFSR. In general, it is very difficult to encode a test cube that has more specified positions than the length of the LFSR. Second, the loading of the seed and test pattern generation therefrom are done in two separate, non-overlapping phases. This results in poor utilization of the tester time.

A different attempt to reduce test application time and test data volume is described in I. Hamzaoglu et al., "Reducing Test Application Time For Full Scan Embedded Cores," *Proc. FTCS-29*, pp. 260–267 (1999). This so-called parallel-serial full scan scheme divides the scan chain into multiple partitions and shifts in the same test pattern to each scan chain through a single scan input. Clearly, a given test pattern must not contain contradictory values on corresponding cells in different chains loaded through the same input. Although partially specified test cubes may allow such operations, the performance of this scheme strongly relies on the scan chain configuration, i.e., the number of the scan chains used and the assignment of the memory elements to the scan chains. In large circuits such a mapping is unlikely to assume any desired form, and thus the solution is not easily scalable. Furthermore, a tester using this scheme must be able to handle test patterns of different scan chain lengths, a feature not common to many testers.

SUMMARY

A method according to the invention is used to generate a compressed test pattern to be applied to scan chains in an integrated circuit under test. The compressed test pattern is stored in an ATE and is applied on input channels to an integrated circuit being tested. A clock signal is used to synchronize transfer of data (the compressed pattern) from the ATE to the integrated circuit. The compressed pattern is decompressed on the integrated circuit to obtain a test pattern, which is passed to scan chains to test faults within the integrated circuit. The scan chains include a plurality of scan cells (memory elements) coupled together that store the test pattern.

In one aspect, the compressed pattern is created by using a test cube with only a portion of the scan cells assigned predetermined values. The remaining scan cells in the test cube may be left unassigned and are filled with a pseudo-random pattern generated by the decompressor during testing. Thus, the ATPG tool generates test vectors without filling the "don't care" positions with random patterns. Symbolic expressions are generated that are associated with the scan cells and that are a function of externally applied input variables. A set of equations is formulated by equating the symbolic expressions to the values assigned to the scan cells. The compressed pattern is created by solving the set of equations using known techniques. To generate the symbolic expressions, input variables are assigned to bits applied to the input channels. Symbolic simulation of the decompressor is used to create the symbolic expressions as a linear combination of the input variables. The symbolic expressions are then assigned to the scan cells within the scan chains.

In another aspect, after solving the equations, new equations can be incrementally appended to the existing set of equations to test another fault. The resulting new set of equations may be solved if a solution exists. If no solution exists, the most recently appended equations are deleted and another fault is selected. The process of incrementally appending equations by selecting new faults continues until a limiting criteria is reached, such as a predetermined limit of unsuccessful attempts is reached, or a predetermined number of bits in the test cube are assigned values.

These and other aspects and features of the invention are described below with reference to the accompanying drawings.

BRIEF DESCRIPTION OF THE DRAWINGS

FIG. 5 is a flowchart of a method for compressing a test pattern.

FIG. 6 is a flowchart of a method for generating symbolic expressions used in compressing a test pattern.

FIG. 7 shows an example of symbolic expressions generated using the method of FIG. 6.

DETAILED DESCRIPTION

The methods for compacting test patterns as shown and described herein are implemented in software stored on a computer-readable medium and executed on a general-purpose computer. The invention, for example, can be implemented in computer aided-design tools. For clarity, only those aspects of the software germane to the invention are described; product details well known in the art are omitted. For the same reason, the computer hardware is not described in further detail. It should thus be understood that the invention is not limited to any specific computer language, program, or computer.

Figure 1:
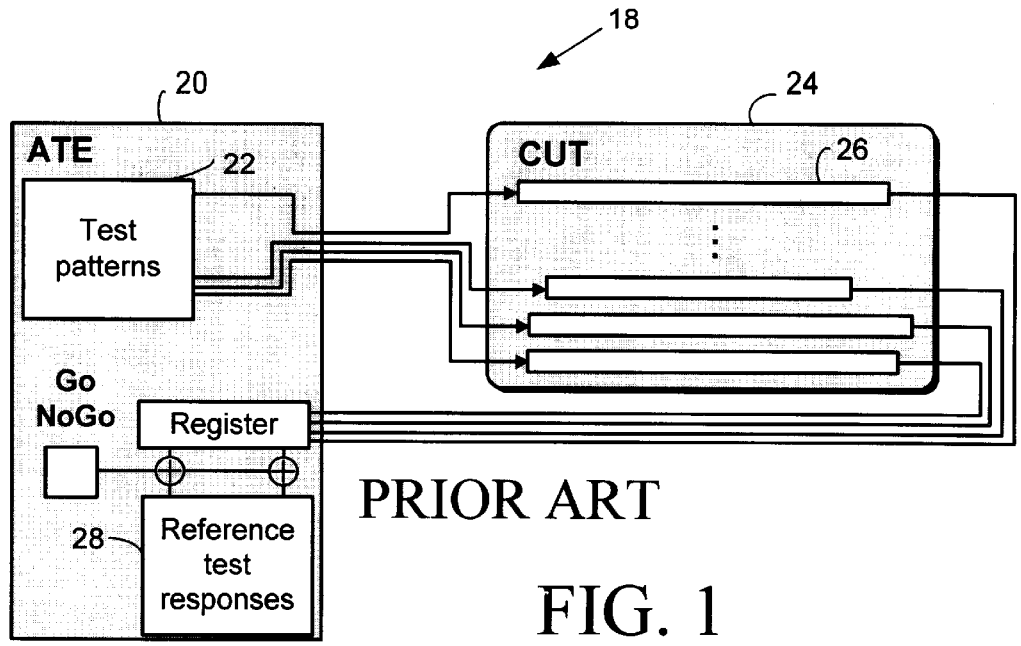
FIG. 1 is a block diagram of a conventional system for testing digital circuits with scan chains.
Figure 2:
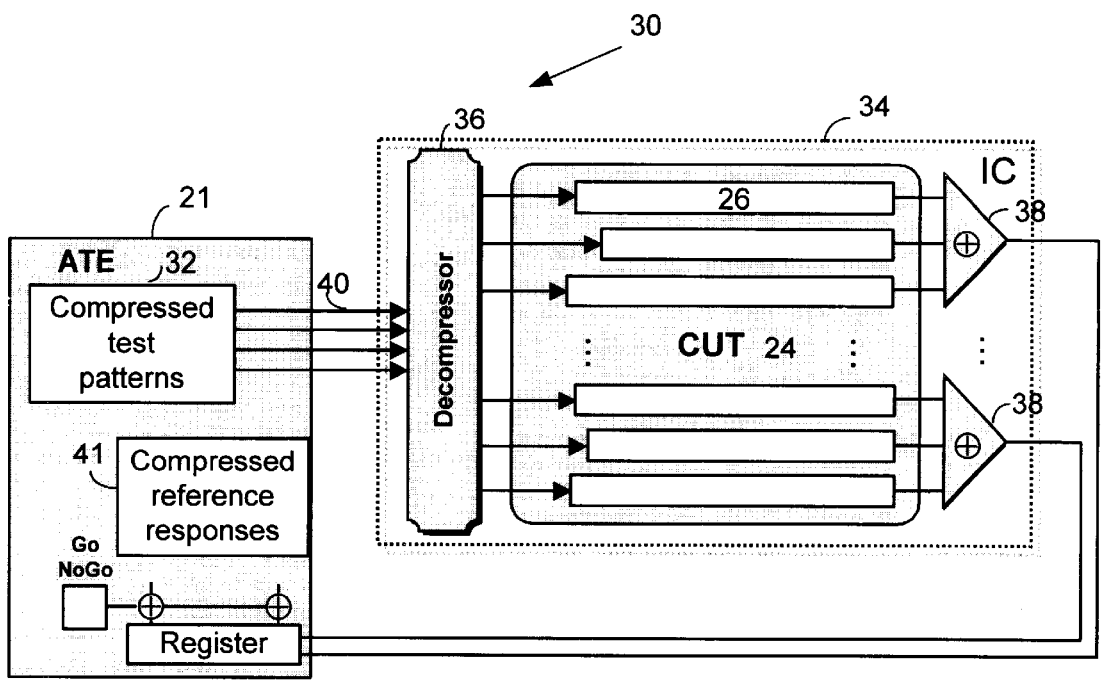
FIG. 2 is a block diagram of a test system according to the invention for testing digital circuits using an ATE.

FIG. 2 is a block diagram of a system 30 according to the invention for testing digital circuits with scan chains. The system includes a tester 21 such as external automatic testing equipment (ATE) and a circuit 34 that includes as all or part of it a circuit-under-test (CUT) 24. The tester 21 provides from storage a set of compressed test patterns 32 of bits, one pattern at a time, through input channels 40 to the circuit 34 such as an IC. A compressed pattern, as will be described, contains far fewer bits than a conventional uncompressed test pattern. A compressed pattern need contain only enough information to recreate deterministically specified bits. Consequently, a compressed pattern is typically 2% to 5% of the size of a conventional test pattern and requires much less tester memory for storage than conventional patterns.

Additionally, compressed test patterns require much less time to transfer from a tester to a CUT 24.

Unlike in the prior reseeding techniques described above, the compressed test patterns 32 are continuously provided from the tester 21 to scan chains 26 within the CUT 24 without interruption. As the compressed test pattern is being provided by the tester 21 to the input channels of a decompressor 36 within the circuit 34, the decompressor decompresses the compressed pattern into a decompressed pattern of bits. The decompressed test pattern is then applied to the scan chains 26. This application is typically accomplished while the compressed test pattern is being provided to the circuit 34. After circuit logic within the CUT 24 is clocked with a decompressed test pattern in the scan chains 26, the test response to that pattern is captured in the scan chains and transferred to the tester 21 for comparison with the compressed fault-free reference responses 41 stored therein.

In a typical configuration, the decompressor 36 has one output per scan chain 26, and there are more scan chains than input channels to the decompressor. However, other configurations are also possible in which the decompressor outputs are less than or equal to the input channels. The decompressor generates in a given time period a greater number of decompressed bits at its outputs than the number of compressed pattern bits it receives during the same time period. This is the act of decompression, whereby the decompressor 36 generates a greater number of bits than are provided to it in a given time period.

To reduce the data volume of the test response and the time for sending the response to the tester, the circuit 34 can include means for compressing the test response that is read from the scan chains 26. One structure for providing such compression is one or more spatial compactors 38. The compressed test responses produced by the compactors 38 are then compared one by one with compressed reference responses 40. A fault is detected if a reference response does not match an actual response.

The providing of a compressed test pattern to a circuit, its decompression into a decompressed test pattern, and the application of the decompressed test pattern to the scan chains is performed synchronously, continuously, and substantially concurrently. The rate at which each step occurs, however, can vary. All steps can be performed synchronously at a same clock rate if desired. Or the steps can be performed at different clock rates. If the steps are performed at the same clock rate, or if the compressed test patterns are provided and decompressed at a higher clock rate than at which the decompressed test patterns are applied to the scan chains, then the number of outputs of decompressor 36 and associated scan chains will exceed the number of input channels of the decompressor, as in FIG. 2. In this first case, decompression is achieved by providing more decompressor outputs than input channels. If the compressed test patterns are provided at a lower clock rate and decompressed and applied to the scan chains at a higher clock rate, then the number of outputs and associated scan chains can be the same, fewer, or greater than the number of input channels. In this second case, decompression is achieved by generating the decompressed test pattern bits at a higher clock rate than the clock rate at which the compressed test pattern bits are provided.

Figure 3:
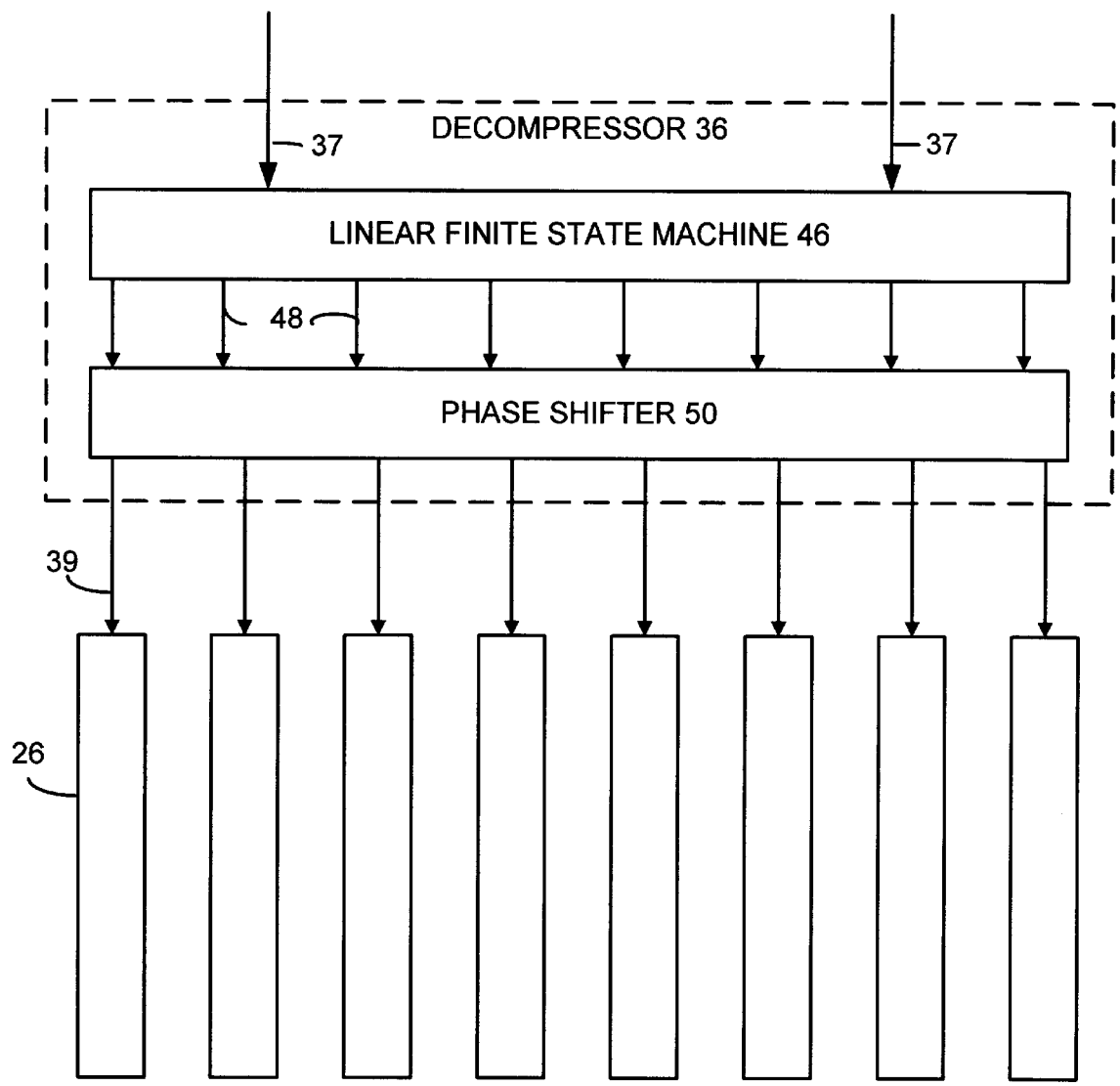
FIG. 3 is a block diagram of a decompressor according to the invention, including a linear finite state machine (LFSM) and phase shifter.

FIG. 3 is a block diagram of a decompressor according to the invention. The decompressor 36 comprises a linear finite state machine (LFSM) 46 coupled, if desired, through its taps 48 to a phase shifter 50. The LFSM through the phase shifter provides highly linearly independent test patterns to the inputs of numerous scan chains in the CUT 24. The LFSM can be built on the basis of the canonical forms of linear feedback shift registers, cellular automata, or transformed LFSRs that can be obtained by applying a number of m-sequence preserving transformations. The output of the LFSM is applied to the phase shifter, which ensures that the decompressed patterns present within the multiple scan chains 26 at any given time do not overlap in pattern (i.e., are out of phase).

The concept of continuous flow decompression described herein rests on the fact noted above that deterministic test patterns typically have only between 2 to 5% of bits deterministically specified, with the remaining bits randomly filled during test pattern generation. Test patterns with partially specified bit positions are defined as test cubes, an example of which appears in Table 2 below. These partially specified test cubes are compressed so that the test data volume that has to be stored externally is significantly reduced. The fewer the number of specified bits in a test cube, the better is the ability to encode the information into a compressed pattern. The ability to encode test cubes into a compressed pattern is exploited by having a few decompressor input channels driving the circuit-under-test, which are viewed by the tester as virtual scan chains. The actual CUT 24, however, has its memory elements connected into a large number of real scan chains. Under these circumstances, even a low-cost tester that has few scan channels and sufficiently small memory for storing test data can drive the circuit externally.

Figure 4:
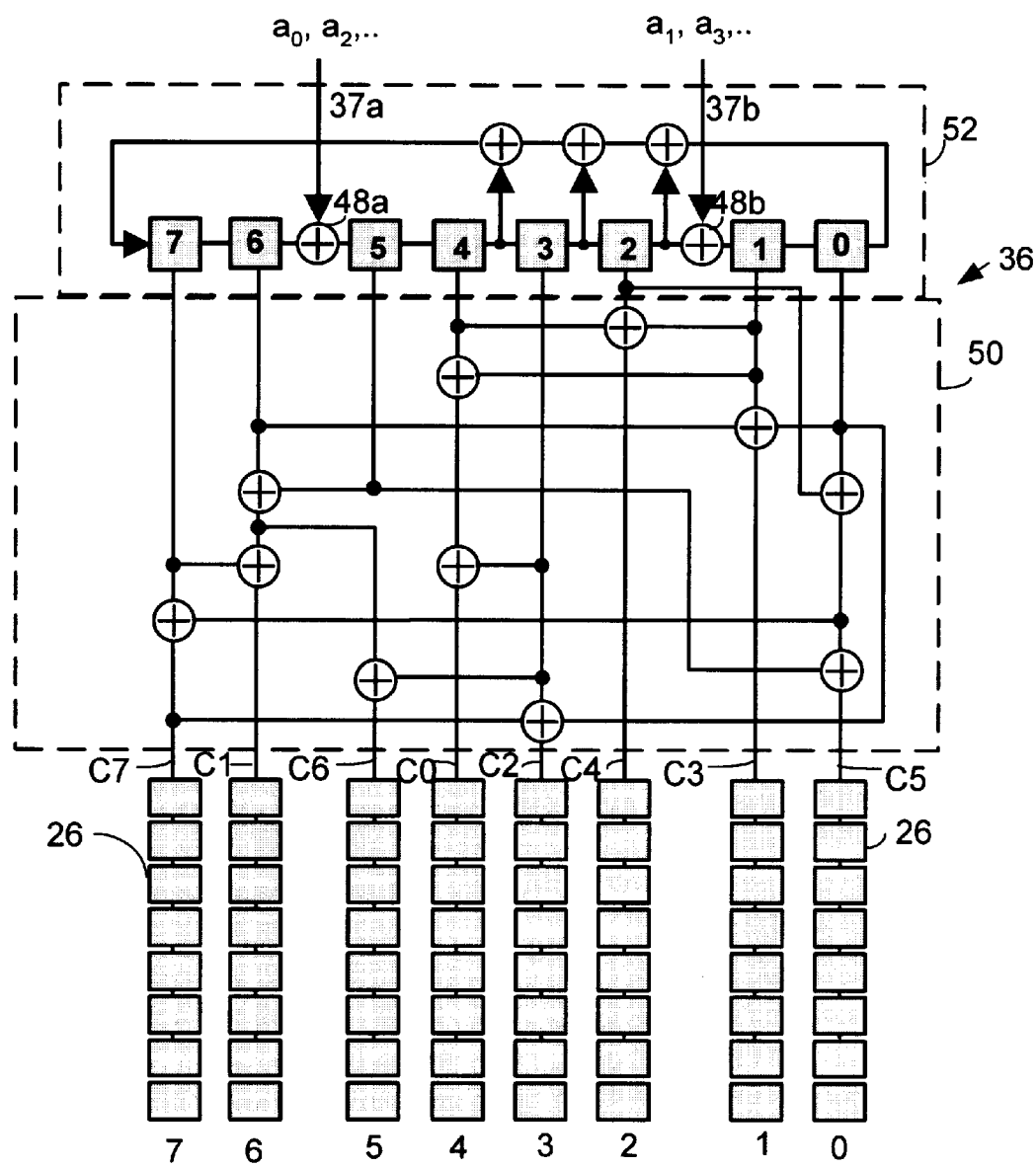
FIG. 4 shows in more detail a first embodiment of the decompressor of FIG. 3 coupled to multiple scan chains.

FIG. 4 shows in more detail the decompressor. The LFSM is embodied in an eight stage Type 1 LFSR 52 implementing primitive polynomial $h(x)=x^8+x^4+x^3+x^2+1$. The shifter 50, embodied in a number of XOR gates, drives eight scan chains 26, each having eight scan cells (the illustrated scan cells are memory elements each storing 1 bit of information). The structure of the phase shifter is selected in such a way that a mutual separation between its output channels C0–C7 is at least eight bits, and all output channels are driven by 3-input (tap) XOR functions having the following forms:

TABLE 1

| | |
|---|---|
| $C_0 = S_4 \oplus S_3 \oplus S_1$ | $C_4 = S_4 \oplus S_2 \oplus S_1$ |
| $C_1 = S_7 \oplus S_6 \oplus S_5$ | $C_5 = S_5 \oplus S_2 \oplus S_0$ |
| $C_2 = S_7 \oplus S_3 \oplus S_2$ | $C_6 = S_6 \oplus S_5 \oplus S_3$ |
| $C_3 = S_6 \oplus S_1 \oplus S_0$ | $C_7 = S_7 \oplus S_2 \oplus S_0$ | where $C_i$ is the ith output channel and $s_k$ indicates the kth stage of the LFSR. Assume that the LFSR is fed every clock cycle through its two input channels 37a, 37b and input injectors 48a, 48b (XOR gates) to the second and the sixth stages of the register. The input variables "a" (compressed test pattern bits) received on channel 37a are labeled with even subscripts ($a_0$, $a_2$, $a_4$, . . . ) and the variables "a" received on channel 37b are labeled with odd subscripts ($a_1$, $a_3$, $a_5$, . . . ). As further described below in relation to FIG. 5, treating these external variables as Boolean, all scan cells can be conceptually filled with symbolic expressions being linear functions of input variables injected by tester 21 into the LFSR 52. Given the feedback polynomial, the phase shifter 50, the location of injectors 48a, b as well as an additional initial period of four clock cycles during which only the LFSR is supplied by test data, the contents of each scan cell within the scan chains 26 in FIG. 4 can be logically determined.

FIG. 5 shows a flowchart of a method for compressing a test pattern. In a first process block 60, symbolic expressions are generated that are associated with scan cells. The generated symbolic expressions are based on symbolic simulation of the decompressor with a continuous stream of external input variables being provided on the input channels to the decompressor. Concurrently while the input variables are provided to the decompressor, the decompressor is in its normal mode of operation, wherein the input variables are being decompressed. Typically, scan chains coupled to the decompressor are also loaded concurrently while the input variables are applied to the decompressor. FIG. 6 provides further details on a technique for generating the symbolic expressions and is followed by a specific example.

In process block 62 (FIG. 5), a test cube is generated. The test cube is a deterministic pattern of bits wherein each bit corresponds to a scan cell in the scan chains. Some of the scan cells are assigned values (e.g., a logic 1 or logic 0), while other scan cells are "don't cares." The scan cells that are assigned values are used in the compression analysis and are represented in the compressed test pattern. The remaining scan cells that are "don't cares" need not be represented in the compressed test pattern and are filled with a pseudo-random values generated by the decompressor.

In process block 64, a plurality of equations is formulated by equating the symbolic expressions generated in process block 60 to the values assigned to the scan cells in process block 62. Typically, only the scan cells that are assigned values are used in formulating the equations. By using a reduced number of equations, compression of the test cube can be maximized. In process block 66, the equations are solved using known techniques, such as Gauss-Jordon elimination.

FIG. 6 provides further details on generation of the symbolic expressions. The generation of the symbolic expressions is typically carried out in a simulated environment, although mathematical analysis also may be used. In process block 70 the decompressor is reset. For example, in the decompressor of FIG. 4, the memory elements 0–7 in the LFSR 52 are reset to a logic low. In process block 72, input variables are assigned to bits on the input channels. For example, during one or more clock cycles a different input variable may be assigned to each input channel. The input variables are applied to the decompressor and cycle through the memory elements within the decompressor in accordance with the decompressor logic. Using symbolic simulation, the outputs of the decompressor as a function of the input variables are determined (process block 74). In particular, symbolic simulation of the decompressor is performed by operating the decompressor in its normal mode of operation (i.e., decompressing) concurrently with the input variables being injected into the decompressor. Additionally, the decompressor outputs decompressed data concurrently with the injection of the input variables that is used to fill scan cells within the scan chains. In process block 76, each output expression is assigned to a corresponding scan cell within a scan chain. That is, an association is made between the expressions and the scan cells.

Thus, for a given structure of a decompressor, a plurality of symbolic expressions is formed for each scan cell as linear combinations of the input variables. In this case, a linear expression is characterized by the set of variables involved. In every one or more clock cycles of the decompressor (depending on the clocking scheme), a new set of k input variables, where k is the number of external inputs, is loaded into the LFSM through the XOR gates. As a result, linear combinations of already injected variables can be associated with each memory element of the LFSM. Since at the beginning, for every new test pattern the decompressor is reset, the corresponding expressions associated with the memory elements of the LFSM are empty. In every cycle, a new expression associated with a given memory element, called a destination element, of an LFSM is computed based on the expressions of other memory elements and input channels, called sources, feeding the given memory element. The particular forms of these expressions depend on functionality, structure or internal connectivity of the LFSM as well as locations of the seed variables injection sites.

The same principle of generation of symbolic expressions applies to outputs of a phase shifter, which implements a linear function of the LFSM memory elements. For all output channels of the phase shifter similar symbolic expressions are generated by adding altogether in the Galois field modulo 2 expressions associated with those stages of the LFSM that are used to drive, through the XOR function, successive outputs of the phase shifter. The resultant expressions are subsequently linked with successive cells of scan chains driven by these decompressor outputs. The linking is done at times that exactly correspond to the shifting of scan chains. If the decompressor and the scan chains operate at the same frequency, the output expressions are computed for every cycle of the decompressor operation. If the scan chains work at a frequency that is a sub-multiple of that of the decompressor, the decompressor equations are computed in every clock cycle, however the scan cell equations are computed only for those cycles that correspond to shift. This operation allows higher transfer rate to the decompressor while reducing the power dissipation in the circuit under test. The scan chains may further be divided into several groups with separate shift clocks to allow independent shift operation. In this case the computation of symbolic expressions mimic exactly the circuit operation.

FIG. 7 gives the expressions for the 64 scan cells in FIG. 4, with the scan chains numbered 0 through 7 in FIG. 4 corresponding to the scan chains C7, C1, C6, . . . identified in FIG. 4. The expressions for each scan chain in FIG. 4 are listed in the order in which the information is shifted into the chain, i.e., the topmost expression represents the data shifted in first. The input variables $a_0$, $a_2$, $a_4$, . . . are assigned to the input channel 37a, while $a_1$, $a_3$, $a_5$, . . . are assigned to 37b. Given the decompressor logic, the outputs of the decompressor are determined as a function of the input variables, as shown in FIG. 7. In the illustrated example, each clock cycle the output of the decompressor is loaded into the scan chains. Consequently, each scan cell has an equation associated with it.

Either before or after the generation of the symbolic expressions, a test cube is generated. The test cube is a deterministic pattern based on the fault being tested. Assume that the decompressor 36 in FIG. 4 is to generate a test pattern based on the following partially specified test cube in Table 2 (the contents of the eight scan chains are shown here horizontally, with the leftmost column representing the information that is shifted first into the scan chains):

TABLE 2

| | |
|---|---|
| x x x x x x x x | scan chain 0 |
| x x x x x x x x | scan chain 1 |
| x x x x 1 1 x x | scan chain 2 |
| x x 0 x x x 1 x | scan chain 3 |
| x x x x 0 x x 1 | scan chain 4 |
| x x 0 x 0 x x x | scan chain 5 |
| x x 1 x 1 x x x | scan chain 6 |
| x x x x x x x x | scan chain 7 |

The variable x denotes a "don't care" condition. The compressed test pattern is determined by equating the equations of FIG. 7 with the assigned bits in the test cube. Then a corresponding compressed test pattern can be determined by solving the following system of ten equations from FIG. 7 using any of a number of well-known techniques such as Gauss-Jordan elimination techniques. The selected equations correspond to the deterministically specified bits:

TABLE 3

$a_2 \oplus a_6 \oplus a_{11} = 1$
$a_0 \oplus a_1 \oplus a_4 \oplus a_8 \oplus a_{13} = 1$
$a_4 \oplus a_5 \oplus a_9 \oplus a_{11} = 0$
$a_0 \oplus a_2 \oplus a_5 \oplus a_{12} \oplus a_{13} \oplus a_{17} \oplus a_{19} = 1$
$a_1 \oplus a_2 \oplus a_4 \oplus a_5 \oplus a_6 \oplus a_8 \oplus a_{12} \oplus a_{15} = 0$
$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21} = 1$
$a_2 \oplus a_3 \oplus a_4 \oplus a_9 \oplus a_{10} = 0$
$a_0 \oplus a_1 \oplus a_2 \oplus a_6 \oplus a_7 \oplus a_8 \oplus a_{13} \oplus a_{14} = 0$
$a_3 \oplus a_4 \oplus a_5 \oplus a_6 \oplus a_{10} = 1$
$a_0 \oplus a_1 \oplus a_3 \oplus a_7 \oplus a_8 \oplus a_9 \oplus a_{10} \oplus a_{14} = 1$ It can be verified that the resulting seed variables $a_0$, $a_1$, $a_2$, $a_3$ and $a_{13}$ are equal to the value of one while the remaining variables assume the value of zero. This seed will subsequently produce a fully specified test pattern in the following form (the initial specified positions are underlined):

TABLE 4

1 0 1 0 0 1 0 0
1 1 0 0 0 1 0 0
1 1 1 1 1 <u>1</u> 1 0
0 0 <u>0</u> 1 0 0 1 <u>1</u>
1 0 1 0 <u>0</u> 0 0 <u>1</u>
1 1 <u>0</u> 1 <u>0</u> 0 0 0
1 1 <u>1</u> 1 <u>1</u> 1 1 1
0 1 0 0 1 1 0 0

As can be observed, the achieved compression ratio (defined as the number of scan cells divided by the number of compressed pattern bits) is 64/(2×8+2×4)≈2.66. The fully specified test pattern is then compressed into a compressed pattern of bits using any of a number of known methods. The unspecified bits are filled in with pseudo-random values in accordance with the logic of the decompressor.

Figure 8:
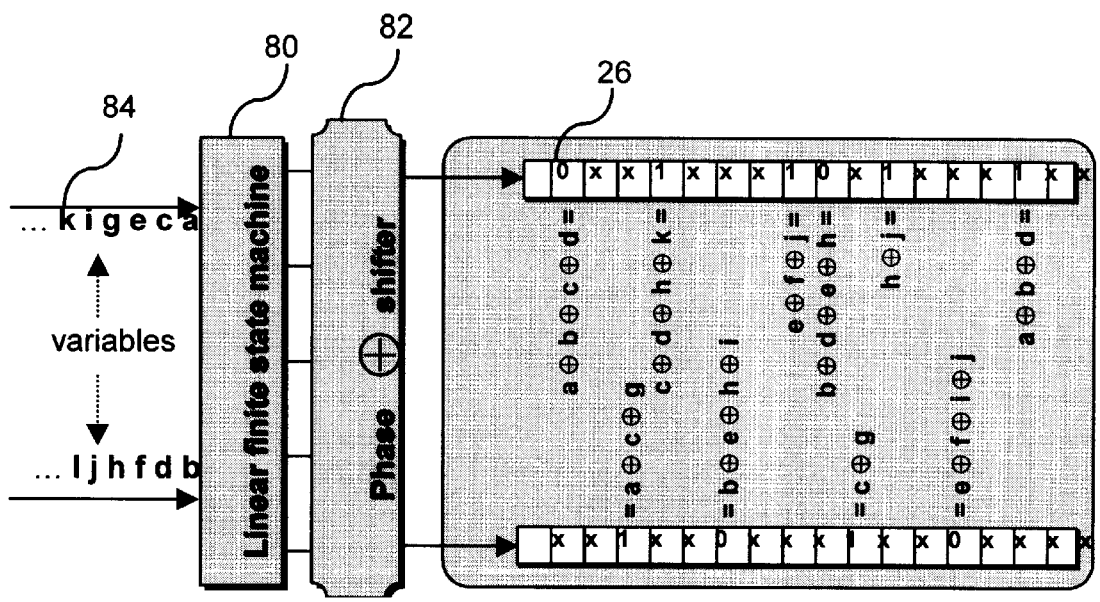
FIG. 8 shows another embodiment of the present invention with input variables being applied to the integrated circuit via input channels.

FIG. 8 shows another representation of the compression process. More particularly, the decompressor includes an LFSM 80 and an associated linear phase shifter 82. The LFSM is fed by a number of external inputs channels 84, while the phase shifter is comprised of an XOR network employed to avoid shifted versions of the same data in its various output channels (scan chains 26). The LFSM can drive a large number of scan chains despite that it is relatively small. The phase shifter 82 provides a linear combination of the LFSM stage outputs. The LFSM generates a sequence with the desired separation from other sequences by employing the "shift-and-add" property according to which the sum of any sequence produced by the LFSM and a cyclic shift of itself is another cyclic shift of this sequence. As can be seen in FIG. 8, particular scan cells are assigned predetermined values, while other scan cells are "don't cares" as indicated by an "x". Only scan cells that are assigned predetermined values are equated with a symbolic expression.

Figure 9:
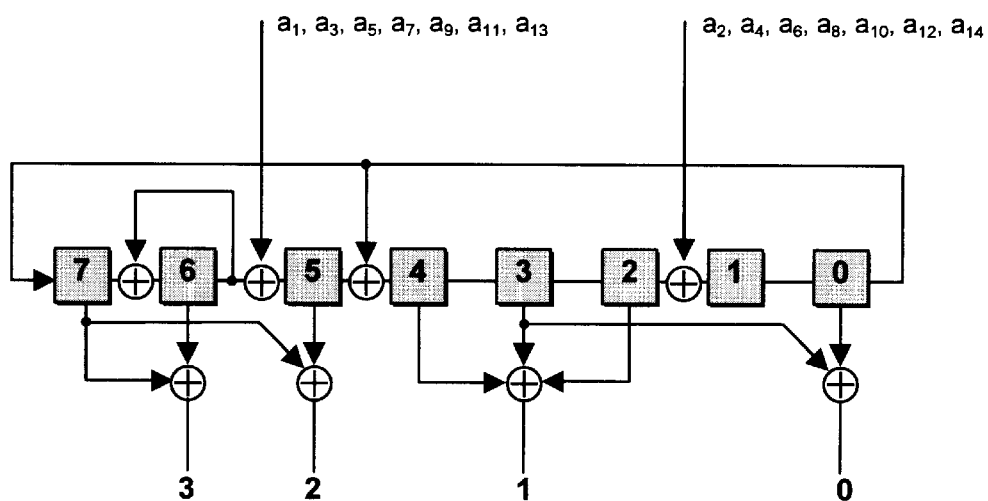
FIG. 9 shows another embodiment of a decompressor.

FIG. 9 shows a decompressor and phase shifter and is used to illustrate the derivation of symbolic expressions. The decompressor includes an 8-bit LFSM and a corresponding 4-output phase shifter. The architecture of the LFSM has been obtained by transforming an 8-bit linear feedback shift register implementing primitive polynomial $x^8+x^6+x^5+x+1$. The input variables $a_1, a_2, \ldots, a_{14}$ are provided in pairs through two external inputs connected by means of the XOR gates to inputs of memory elements 1 and 5, respectively. The phase shifter consists of four XOR gates connected to the outputs of the LFSM. In the illustrated embodiment, it is desirable that the output expressions are not generated until all memory elements of the LFSM are filled with at least one input variable. Typically, the number of cycles required to load the LFSM varies depending on the design. For example, the number of cycles to load the LFSM may depend on the LFSM and the number of input channels, but other criteria may be used. As illustrated in Table 5, in the illustrated embodiment, all of the memory elements are filled after four consecutive clock cycles. Continued operation of the decompressor yields the expressions gathered in the second part of Table 5 (starting on the $5^{th}$ cycle). Expressions produced on the outputs of the phase shifter since then are presented in Table 6. New seed variables are injected into the LFSM in parallel to, or concurrently with, the scan cells being filled.

are obtained by selecting the symbolic expressions corresponding to specified positions of the test cubes (they form the left-hand sides of the equations) and assigning values of these specified positions to the respective expressions. Thus, the right-hand sides of the equations are defined by the specified positions in the partially specified test patterns. As can be seen, the process of finding an appropriate encoding of a given test cube is equivalent to solving a system of linear equations in the Galois field modulo 2. Solving the equations can be carried out very efficiently using Gauss-Jordan elimination by taking advantage of fast bit-wise operations. If the system of linear equations has a solution, it can be treated as a compressed test pattern, i.e. having the property that when provided to the decompressor yields the decompressed test pattern consistent with the initial, partially specified test vector. In order to increase probability of successful encoding, it is desirable to generate test cubes with the smallest achievable number of specified positions. Consequently, it will reduce the number of equations while maintaining the same number of input variables, and thus increasing likelihood of compression.

TABLE 6

| 3 | 2 | 1 | 0 |
|---|---|---|---|
| $a_2 \oplus a_4 \oplus a_6$ | $a_2 \oplus a_6 \oplus a_9$ | $a_2 \oplus a_3 \oplus a_4 \oplus a_5 \oplus a_6 \oplus a_7$ | $a_4 \oplus a_5 \oplus a_8$ |
| $a_2 \oplus a_4 \oplus a_6 \oplus a_8$ | $a_2 \oplus a_4 \oplus a_8 \oplus a_{11}$ | $a_2 \oplus a_4 \oplus a_5 \oplus a_6 \oplus a_7 \oplus a_8 \oplus a_1 \oplus a_6 \oplus a_7 \oplus a_9$ | $a_{10}$ |
| $a_1 \oplus a_2 \oplus a_4 \oplus a_6 \oplus a_1 \oplus a_2 \oplus a_4 \oplus a_6 \oplus a_{10}$ | $a_1 \oplus a_4 \oplus a_6 \oplus a_7 \oplus a_8 \oplus a_9 \oplus a_3 \oplus a_8 \oplus a_9 \oplus$ | | |
| $a_8 \oplus a_{10}$ | $\oplus a_{13}$ | $a_{10} \oplus a_{11}$ | $a_{12}$ |

Figure 10:
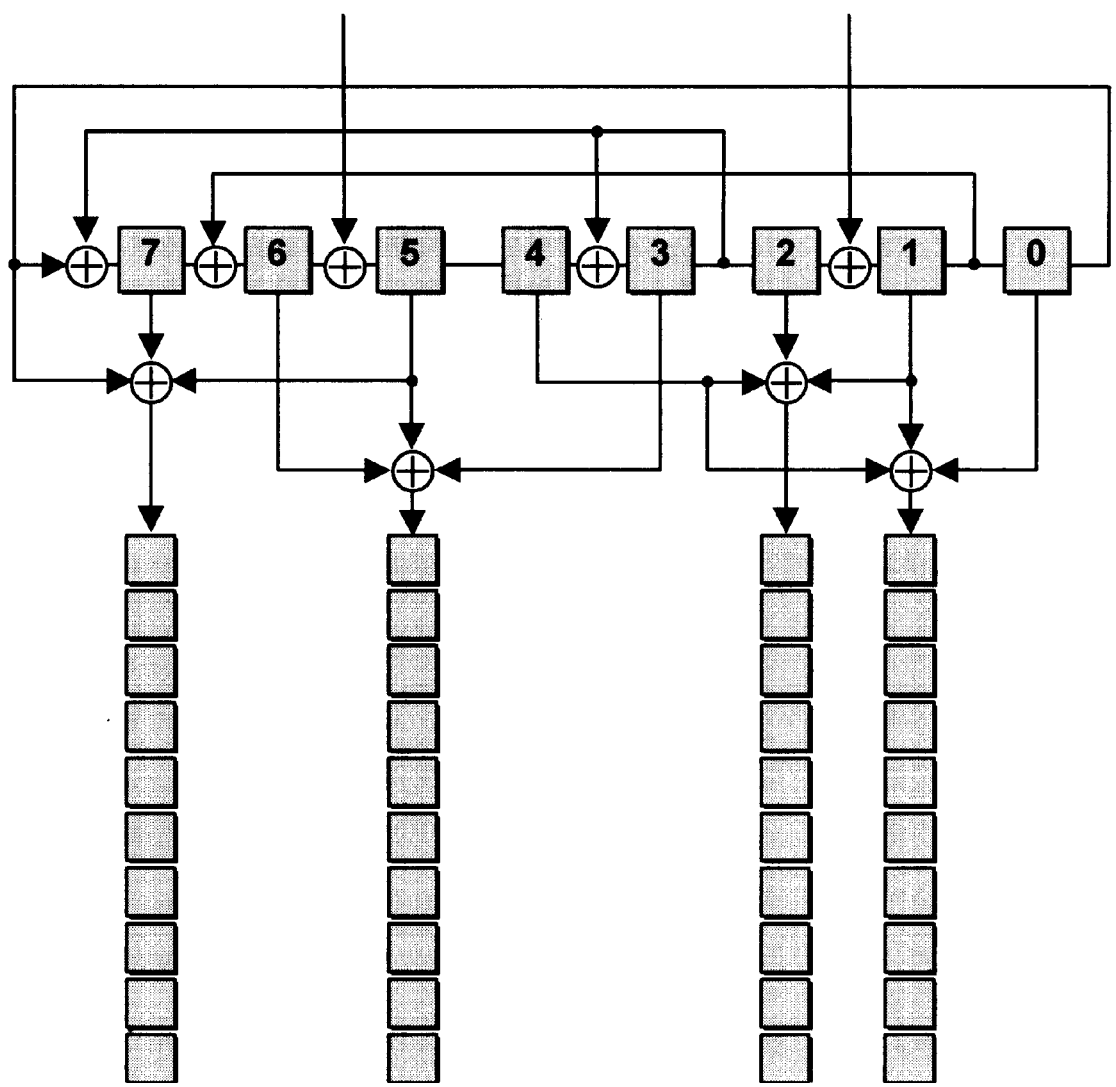
FIG. 10 shows yet another embodiment of the decompressor.

For the sake of illustration, consider an example 8-bit decompressor with two external inputs that drives four 10-bit scan chains as shown in FIG. 10. If this circuit is to generate a test pattern based on the following partially specified test cube (the contents of the four scan chains are shown here horizontally) shown in Table 7:

TABLE 7 x x x x x x x x x x
x x x 1 1 x 0 x x 1
x x 0 x x 1 x x 0 0
x 1 x 1 x x x x x x where x denotes a "don't care" condition, then a corresponding compressed pattern can be determined by solving the

TABLE 5

| 7 | 6 | 5 | 4 | 3 | 2 | 1 | 0 |
|---|---|---|---|---|---|---|---|
| 0 | 0 | $a_1$ | 0 | 0 | 0 | $a_2$ | 0 |
| 0 | 0 | $a_3$ | $a_1$ | 0 | 0 | $a_4$ | $a_2$ |
| $a_2$ | 0 | $a_5$ | $a_2 \oplus a_3$ | $a_1$ | 0 | $a_6$ | $a_4$ |
| $a_4$ | $a_2$ | $a_7$ | $a_4 \oplus a_5$ | $a_2 \oplus a_3$ | $a_1$ | $a_8$ | $a_6$ |
| $a_6$ | $a_2 \oplus a_4$ | $a_2 \oplus a_9$ | $a_6 \oplus a_7$ | $a_4 \oplus a_5$ | $a_2 \oplus a_3$ | $a_1 \oplus a_{10}$ | $a_8$ |
| $a_8$ | $a_2 \oplus a_4 \oplus a_6$ | $a_2 \oplus a_4 \oplus a_{11}$ | $a_2 \oplus a_8 \oplus a_9$ | $a_6 \oplus a_7$ | $a_4 \oplus a_5$ | $a_2 \oplus a_3 \oplus a_{12}$ | $a_1 \oplus a_{10}$ |
| $a_1 \oplus a_{10}$ | $a_2 \oplus a_4 \oplus a_6 \oplus a_8$ | $a_2 \oplus a_4 \oplus a_6 \oplus a_{13}$ | $a_1 \oplus a_2 \oplus a_4 \oplus a_{10} \oplus a_{11}$ | $a_2 \oplus a_8 \oplus a_9$ | $a_6 \oplus a_7$ | $a_4 \oplus a_5 \oplus a_{14}$ | $a_2 \oplus a_3 \oplus a_{12}$ |

Once the symbolic expressions are determined, a system of equations is formulated for each test cube. These equations following system of equations (resulting from the structure of the decompressor of FIG. 9) shown in Table 8:

TABLE 8

$a_1 \oplus a_2 \oplus a_5 \oplus a_8 \oplus a_9 \oplus a_{11} = 0$ $a_5 \oplus a_6 \oplus a_7 \oplus a_9 \oplus a_{10} \oplus a_{11} \oplus a_{12} \oplus a_{13} \oplus a_{15} \oplus a_{18} \oplus a_{19} \oplus a_{20} \oplus a_{21} \oplus a_{23} \oplus a_{24} = 1$ $a_0 \oplus a_1 \oplus a_3 \oplus a_4 \oplus a_5 \oplus a_6 \oplus a_7 \oplus a_9 \oplus a_{12} \oplus a_{13} \oplus a_{14} \oplus a_{15} \oplus a_{17} \oplus a_{18} = 0$ $a_0 \oplus a_1 \oplus a_3 \oplus a_6 \oplus a_7 \oplus a_8 \oplus a_9 \oplus a_{11} \oplus a_{12} = 1$ $a_0 \oplus a_1 \oplus a_2 \oplus a_3 \oplus a_5 \oplus a_8 \oplus a_9 \oplus a_{10} \oplus a_{11} \oplus a_{13} \oplus a_{14} = 1$ $a_0 \oplus a_1 \oplus a_2 \oplus a_3 \oplus a_4 \oplus a_5 \oplus a_6 \oplus a_{11} \oplus a_{12} = 1$ $a_0 \oplus a_1 \oplus a_2 \oplus a_7 \oplus a_8 = 1$ $a_4 \oplus a_5 \oplus a_7 \oplus a_8 \oplus a_{11} \oplus a_{14} \oplus a_{15} \oplus a_{17} = 1$ $a_1 \oplus a_4 \oplus a_5 \oplus a_{12} \oplus a_{13} \oplus a_{15} \oplus a_{16} \oplus a_{19} \oplus a_{22} \oplus a_{23} \oplus a_{25} = 0$ $a_2 \oplus a_3 \oplus a_{10} \oplus a_{11} \oplus a_{13} \oplus a_{14} \oplus a_{17} \oplus a_{20} \oplus a_{21} \oplus a_{23} = 0$ It can be verified that the resulting input variables $a_2$, $a_3$, $a_5$, $a_6$ and $a_{12}$ are equal to the value of one while the remaining variables assume the value of zero. This seed will subsequently produce a fully specified test pattern in the following form (the initial specified position are now underlined) shown in Table 9:

TABLE 9

0 1 1 1 0 1 1 0 0 0
0 1 0 <u>1</u> <u>1</u> 0 <u>0</u> 0 0 <u>1</u>
1 0 <u>0</u> 1 1 <u>1</u> 1 1 <u>0</u> <u>0</u>
0 <u>1</u> 0 <u>1</u> 0 1 1 1 1 0

Furthermore, compression of test patterns is conducted using the ATPG algorithm that targets multiple faults using the information about available encoding space. In one form of the present invention, the faults are selected in such a way that there is no overlap in the assigned inputs. If assignments for a particular fault cannot be found, the encoding space is completely relieved and applied towards another fault. In the second form, cones of excitation can overlap and share assignments. In either case, generation of a test cube for a given fault is followed by the attempt to solve a current set of equations as shown above.

In order to further enhance the efficiency of the compression, an incremental mode is enabled in which new equations for a next targeted fault are appended to the already existing system of equations. Consequently, steps are not repeated for previous faults covered by the same test cube. In fact, it keeps carrying out Gauss-Jordan elimination by utilizing information available from the previous steps. If a solution still exists, the ATPG capable of generating incremental test cube for a subsequent fault is invoked. Otherwise, the recently generated input assignments are canceled and another fault is targeted unless a certain limit of unsuccessful attempts has been reached. In the latter case, a new test cube is created with the corresponding set of linear equations.

Figure 11:
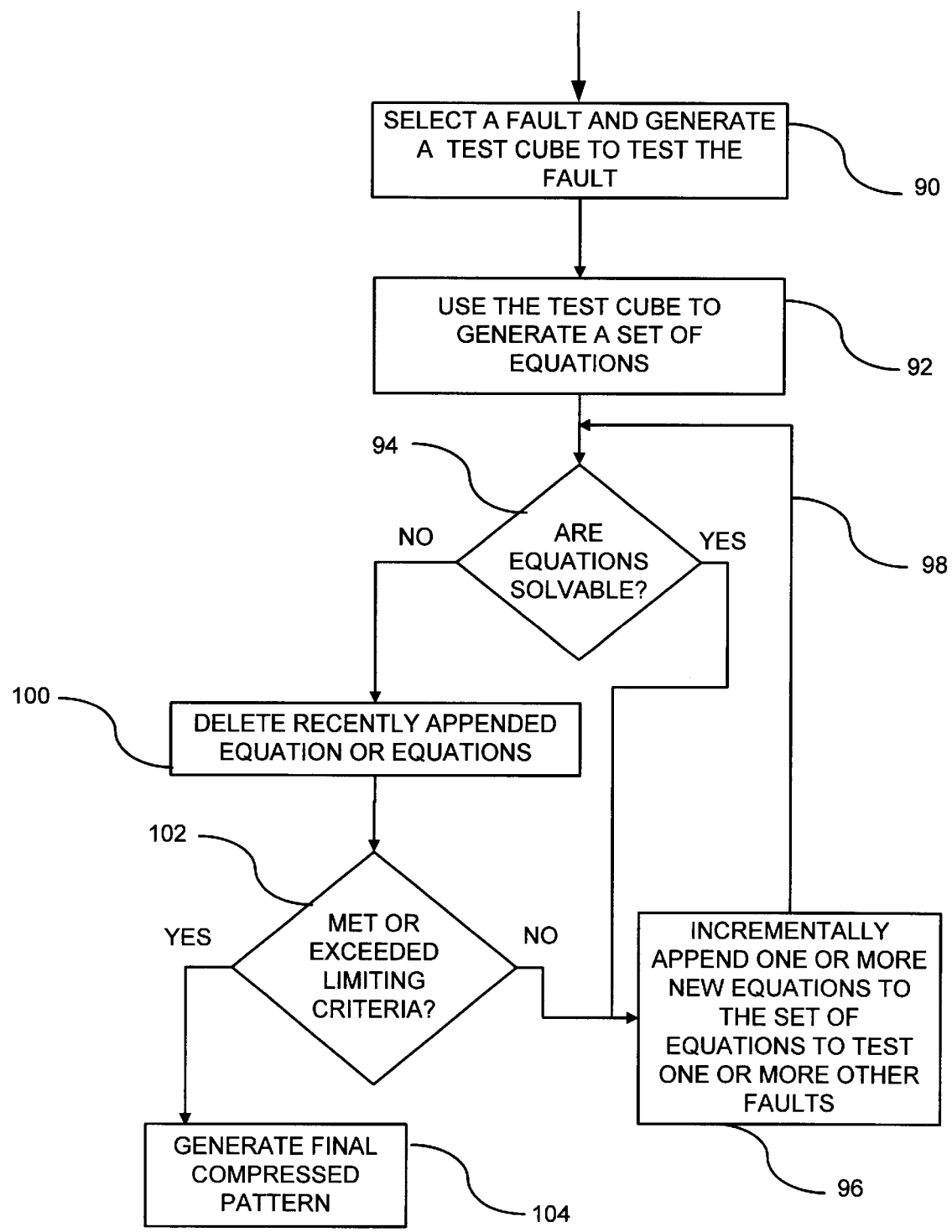
FIG. 11 is a flowchart of a method for incrementally appending symbolic expressions for compression.

FIG. 11 is a flowchart of a method illustrating the incremental mode of compression. In process block 90, a fault is selected and a test cube is generated to test the selected fault. As described previously, the test cube generation is accomplished using a deterministic test pattern.

In process block 92, the test cube is used to generate a set of equations as previously described.

In block 94, a determination is made whether the equations are solvable. If the equations are solvable, in process block 96, the set of equations is incrementally appended with one or more new equations that test one or more other faults. Then a determination is made whether the set of appended equations is solvable as shown by arrow 98. This process continues until the attempt to solve the set of equations fails. Upon a failed attempt to solve the equations, process block 94 is answered in the negative causing control to pass to process block 100. As a result, in process block 100, the most recently appended equation or equations are deleted. In process block 102, a determination is made whether a limiting criteria has been reached, such as the number of failures has equaled or exceeded a predetermined threshold, or a number of specified bits in a test cube is reached. For example, if the number of bits in the test cube that are assigned values reaches 90% or 95% of the number of input variables, the incremental appending can be terminated. Any desired limiting criteria may be used. If the limiting criteria is reached, the final compressed pattern is created (process block 104). If not, process block 96 is again attempted to incrementally append the equations to test yet another fault.

Having illustrated and described the principles of the invention in exemplary embodiments, it should be apparent to those skilled in the art that the illustrative embodiments can be modified in arrangement and detail without departing from such principles. For example, although the decompressor is shown as being on the integrated circuit, it may also be on an ATE. In such a case, the input variables are supplied externally to the decompressor concurrently while the decompressor is operated to generate the output expressions of the decompressor. Additionally, although the generation of symbolic expressions is shown using symbolic simulation of a decompressor, such generation can be accomplished by techniques other than simulation, such as by representing the decompressor mathematically (e.g., a primitive polynomial) and generating the expressions using mathematical analysis. In view of the many possible embodiments to which the principles of the invention may be applied, it should be understood that the illustrative embodiment is intended to teach these principles and is not intended to be a limitation on the scope of the invention. We therefore claim as our invention all that comes within the scope of the following claims and their equivalents.

We claim:

1. A method that computes a compressed test pattern to test an integrated circuit, comprising:

generating symbolic expressions that are associated with scan cells, the symbolic expressions being a function of input variables applied concurrently while the scan cells are being loaded;

generating a test cube having the scan cells assigned predetermined values; and formulating a set of equations by equating the assigned values in the scan cells to the symbolic expressions.

2. The method of claim 1, wherein the values assigned to the scan cells are chosen to test potential faults in the integrated circuit.

3. The method of claim 1, further including storing the compressed test pattern in an ATE and transferring the compressed test pattern to an integrated circuit being tested, wherein the integrated circuit includes a decompressor.

4. The method of claim 1, further including solving the equations to obtain the compressed test pattern and, after solving the equations, incrementally appending the set of equations with one or more equations.

5. The method of claim 4, further including:
   (a) attempting to solve the appended set of equations;
   (b) if the attempt to solve the equations fails, deleting the most recently appended equations and appending one or more different equations onto the set of equations; and
   (c) if the attempt to solve the equations is successful, incrementally appending additional equations onto the set of equations;
   (d) repeating (a)–(c) until a predetermined limiting criteria is reached.

6. The method of claim 1, wherein generating symbolic expressions includes:
   assigning the input variables to bits on input channels to the integrated circuit, wherein the number of input variables is larger than the number of channels;
   simulating the application of the input variables to a decompressor in the integrated circuit and simulating that the decompressor is continually clocked to decompress the input variables, wherein one or more additional input variables are injected into the decompressor during one or more clock cycles; and
   generating a set of output expressions from the decompressor that results from the simulation, wherein the output expressions are based on the input variables that are injected as the decompressor is continually clocked.

7. The method of claim 6, further including assigning each of the output expressions to each scan cell within a scan chain in the integrated circuit.

8. The method of claim 1, further including solving the equations and wherein solving the equations includes performing a Gauss-Jordon elimination method for solving equations.

9. The method of claim 1, wherein generating a test cube includes assigning values of a predetermined logic 1 or a predetermined logic 0 to the scan cells for testing a fault in the integrated circuit.

10. The method of claim 1, further including:
    (a) applying the compressed test pattern to the integrated circuit;
    (b) decompressing the test pattern; and
    (c) loading scan cells within the integrated circuit with the decompressed test pattern;
    (d) wherein (a), (b) and (c) occur substantially concurrently.

11. The method of claim 1, wherein formulating the set of equations includes:
    associating each symbolic expression in a one-to-one relationship with a scan cell; and
    for each scan cell having a predetermined assigned value, equating the symbolic expression associated with that scan cell to the predetermined assigned value.

12. The method of claim 1, wherein generating symbolic expressions includes using simulation of a decompressor.

13. The method of claim 1, wherein generating symbolic expressions includes using a mathematical representation of a decompressor.

14. The method of claim 1, further including:
    (a) applying the compressed test pattern to the integrated circuit;
    (b) decompressing the test pattern; and
    (c) loading scan cells within the integrated circuit with the decompressed test pattern;
    (d) wherein (a), (b) and (c) occur substantially concurrently.

15. A method that computes a compressed test pattern to test an integrated circuit, comprising:
    using simulation, generating symbolic expressions that are associated with simulated scan cells of an integrated circuit, the symbolic expressions being a function of simulated input variables applied concurrently to a simulated decompressor;
    generating a test cube having the scan cells assigned predetermined values; and
    formulating a set of equations by equating the assigned values in the scan cells to the symbolic expressions.

16. The method of claim 15, wherein the values assigned to the scan cells are chosen to test potential faults in the integrated circuit.

17. The method of claim 15, further including solving the equations to obtain the compressed test pattern.

18. The method of claim 17, further including storing the compressed test pattern in an ATE and transferring the compressed test pattern to an integrated circuit being tested, wherein the integrated circuit includes a decompressor.

19. The method of claim 15, further including solving the equations to obtain the compressed test pattern and, after solving the equations, incrementally appending the set of equations with one or more equations.

20. The method of claim 15, further including:
    (a) attempting to solve the appended set of equations;
    (b) if the attempt to solve the equations fails, deleting the most recently appended equations and appending one or more different equations onto the set of equations; and
    (c) if the attempt to solve the equations is successful, incrementally appending additional equations onto the set of equations;
    (d) repeating (a)–(c) until a predetermined limiting criteria is reached.

21. The method of claim 15, wherein generating symbolic expressions includes:
    assigning the input variables to bits on input channels to the integrated circuit, wherein the number of input variables is larger than the number of channels;
    simulating the application of the input variables to a decompressor in the integrated circuit and simulating that the decompressor is continually clocked to decompress the input variables, wherein one or more additional input variables are injected into the decompressor during one or more clock cycles; and
    generating a set of output expressions from the decompressor that results from the simulation, wherein the output expressions are based on the input variables that are injected as the decompressor is continually clocked.

22. The method of claim 21, further including assigning each of the output expressions to each scan cell within a scan chain in the integrated circuit.

23. The method of claim 15, further including solving the equations and wherein solving the equations includes performing a Gauss-Jordon elimination method for solving equations.

24. The method of claim 15, wherein generating a test cube includes assigning values of a predetermined logic 1 or a predetermined logic 0 to the scan cells for testing a fault in the integrated circuit.

25. The method of claim 15, wherein formulating the set of equations includes:
- associating each symbolic expression in a one-to-one relationship with a scan cell; and
- for each scan cell having a predetermined assigned value, equating the symbolic expression associated with that scan cell to the predetermined assigned value.

26. The method of claim 15, wherein generating symbolic expressions includes using simulation of a decompressor.

27. The method of claim 15, wherein generating symbolic expressions includes using a mathematical representation of a decompressor.

* * * * *